United States Patent [19]
Wang

[11] Patent Number: 5,445,718
[45] Date of Patent: Aug. 29, 1995

[54] ELECTROCHEMICAL ETCH-STOP ON N-TYPE SILICON BY INJECTING HOLES FROM A SHALLOW P-TYPE LAYER

[75] Inventor: Su-Chee S. Wang, Troy, Mich.

[73] Assignee: General Motors Corporation, Detroit, Mich.

[21] Appl. No.: 185,084

[22] Filed: Jan. 24, 1994

[51] Int. Cl.$^6$ .............................................. C25F 3/12
[52] U.S. Cl. ........................ 204/129.1; 204/129.43; 204/129.65; 204/129.75; 437/62; 437/947
[58] Field of Search ........... 204/129.1, 129.43, 129.65, 204/129.75; 156/662; 437/62, 947, DIG. 12

[56] References Cited

U.S. PATENT DOCUMENTS

| | | | |
|---|---|---|---|
| 5,071,510 | 12/1991 | Findler et al. | 156/647 |
| 5,129,982 | 7/1992 | Wang et al. | 156/628 |
| 5,285,083 | 2/1994 | Pulfrey et al. | 257/52 |

FOREIGN PATENT DOCUMENTS 295636  12/1986  Japan .

*Primary Examiner*—John Niebling
*Assistant Examiner*—Edna Wong
*Attorney, Agent, or Firm*—Cary W. Brooks

[57] ABSTRACT

The invention generally includes a method of selectively etching a body of silicon material wherein a silicon wafer is used as a working electrode and having an n-type region and a relatively shallow p-type layer. The working electrode and a counterelectrode are placed in a liquid etchant. High voltage pulses, greater than 2 V are applied between the working electrode and the counterelectrode so that holes from the p-type layer are injected into the n-type region and etching is stopped due to oxidation of the n-type region. The technique is useful in producing very thin n-type membranes.

10 Claims, 3 Drawing Sheets

ELECTROCHEMICAL ETCH-STOP ON N-TYPE SILICON BY INJECTING HOLES FROM A SHALLOW P-TYPE LAYER

FIELD OF THE INVENTION

The invention generally relates to electrochemical etch-stop processes, and more particularly to an electrochemical etch-stop process on n-type silicon by injecting holes from a shallow p-type layer and utilizing a high voltage pulse technique.

BACKGROUND

Anisotropic silicon etching permits the fabrication of three-dimensional mechanical and electronic microstructures. The (111) silicon plane etches very slowly compared to both (100) and (110) planes in etchants with sufficiently high pH value. Typical etchants include KOH, NaOH, LiOH, CsOH, NH4OH, ethylenediamine pyrocatechol, and hydrazine. In addition to the crystal orientation selectivity of these etchants, a sufficiently high constant positive bias applied to a silicon wafer while immersed in the etchant 24 can also passivate the wafer and stop etching. This phenomenon is called the electrochemical etch-stop.

Electrochemical etch-stop can be employed to fabricate thin n-type silicon membranes. FIG. 1A shows the three-electrode etching configuration for fabricating such membranes. The three electrodes are: a Si wafer working electrode 10 including n-type 14 and p-type regions 16 with a p-n junction 12 and a selectively deposited etch mask 22, a platinum counterelectrode 18, and a reference electrode 20. A constant positive bias voltage is applied to the silicon wafer.

Due to the presence of the reverse-bias junction, no current can flow to the p-type layer and therefore it will not be affected by the bias voltage. Thus, the p-type layer will be anisotropically etched. As soon as the p-type layer is etched off, the n-type layer is exposed to the etchant (FIG. 1B). Because of the disappearance of the reverse-bias junction, the n-type layer is now affected by the constant positive bias voltage. Thus, an anodic oxide layer will be formed on the n-type silicon to passivate the surface and stop etching. A thin n-type membrane is formed.

This conventional junction etch-stop permits formation of n-type microstructures. If the doping types of the silicon in FIG. 1 are reversed such that the bias is applied to a p-type layer, and the n-type is exposed to solution, the diode is now forward biased by the applied potential. Because a constant positive bias can cause indiscriminate etch stopping on both p- and n-type wafers, the n-type layer will be passivated prematurely. Therefore, it will be extremely difficult to fabricate thin p-type microstructures using this conventional electrochemical etch-stop technique.

Another electrochemical etching technique selectively etches n-type silicon and fabricates p-type microstructures as disclosed in Wang et al, U.S. Pat. No. 5,129,982. In this technique, pulsed anodizing voltages were applied to silicon samples immersed in KOH:H$_2$O solutions (FIG. 2A). The use of pulsed anodization causes passivation of p-type silicon while n-type silicon continues to etch, making it possible to selectively etch n-type and stop etch on p-type material (FIG. 2B). P-type microstructures of low or moderate doping can thus be fabricated. More details about this technique are described as follows.

First, we applied a 1 second duration, 2 V anodic pulse to both homogeneous p- and n-type silicon samples in 20%/60° C. KOH solutions, and measured the open circuit potential (OCP) recovery after removal of the pulse. Typical OCP recovery curves obtained from p- and n-type silicon samples are shown in FIG. 3. The time until the OCP returns to its initial steady value, which we will call the "dissolution time", corresponds to the complete removal of the anodic oxide formed during the pulse. During the dissolution time the silicon is passivated, however, silicon etching will resume once the anodic oxide is removed. The dissolution time for a homogeneous n-type sample ($t_{dn}$ in FIG. 3) was measured to be 3 seconds, while the dissolution time for a homogeneous p-type sample ($t_{dp}$ in FIG. 3) was measured to be 88 seconds.

These results are consistent with a process which is rate-limited by holes in the semiconductor. Because the hole concentration in p-type silicon is higher than that in n-type, thicker anodic oxide is formed on the p-type silicon during the application of an anodic pulse. Thus, it takes longer to remove the anodic oxide formed on a homogeneous p-type silicon.

If such an anodizing pulse is re-applied before the complete dissolution of the p-type anodic oxide, then the n-type silicon will have undergone some etching while the p-type silicon has remained passivated. This technique can be used as an etch-stop in the formation of p-type silicon microstructures (FIG. 2B). However, prior to the application of this technique, a thin p-type layer with very well controlled thickness has to be grown on a n-type silicon substrate. This thin p-type layer can be epitaxially grown on a n-type silicon wafer. Alternatively, it can also be prepared by predepositing (or ion implanting) boron on a n-type wafer and followed by a drive-in process, so that boron can diffuse to a predetermined depth. However, both sample preparation processes have drawbacks. For example, growing a high quality epitaxial layer could be very costly, and the drive-in process is very time-consuming. Therefore, it is desirable to develop a new etch-stop technique which does not involve epitaxial growth or drive-in processes for sample preparation.

SUMMARY OF THE INVENTION

The invention generally includes a method of selectively etching a body of silicon material wherein a silicon wafer is used as a working electrode. the working electrode includes an n-type region and a relatively shallow p layer. The working electrode and a counterelectrode are placed in a liquid etchant. High voltage pulses, greater than 2 V, are applied between the working electrode and the counterelectrode so that holes from the p-type layer are injected into the n-type region and etching is stopped due to oxidation of the n-type region. The technique is useful in producing very thin n-type membranes.

These and other objects, feature and advantages of the present invention will be apparent from the following brief description of the drawings, detailed description, and appended claims and drawings.

DETAILED DESCRIPTION

Figure 4A:
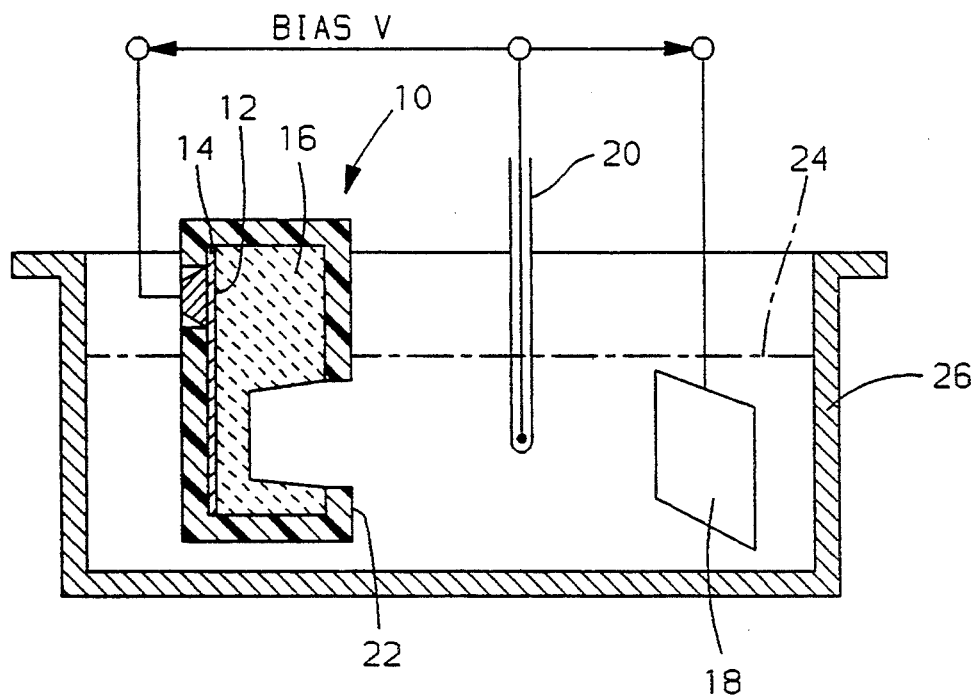
FIGS. 4A and 4B are schematic illustrations of an etched process according to the present invention wherein high voltage pulses are applied between a working electrode including an n-type region and a very shallow p-type layer, and a counterelectrode to produce very thin n-type membranes.

A three-electrode electrochemical etching system was adopted for the new technique of the present invention (FIG. 4A). The three electrodes are: a n-type Si wafer working electrode 10 with a very shallow p-type layer 14 and a selectively deposited etch mask 22, a platinum counterelectrode 18, and a reference electrode 20. All of them were submerged in 20% KOH solutions 24 at 70° C. The shallow p-type layer can be prepared by implanting (or predepositing) boron ions into a n-type silicon wafer. The samples we used to demonstrate this technique was prepared by implanting the n-type silicon wafers with $1 \times 10^{13}$ (or $5 \times 10^{12}$) ions/cm$^2$ dosage of 60 KeV (or 160 KeV) boron ions, respectively. No drive-in process was required in preparing samples for this technique.

Figure 1A:
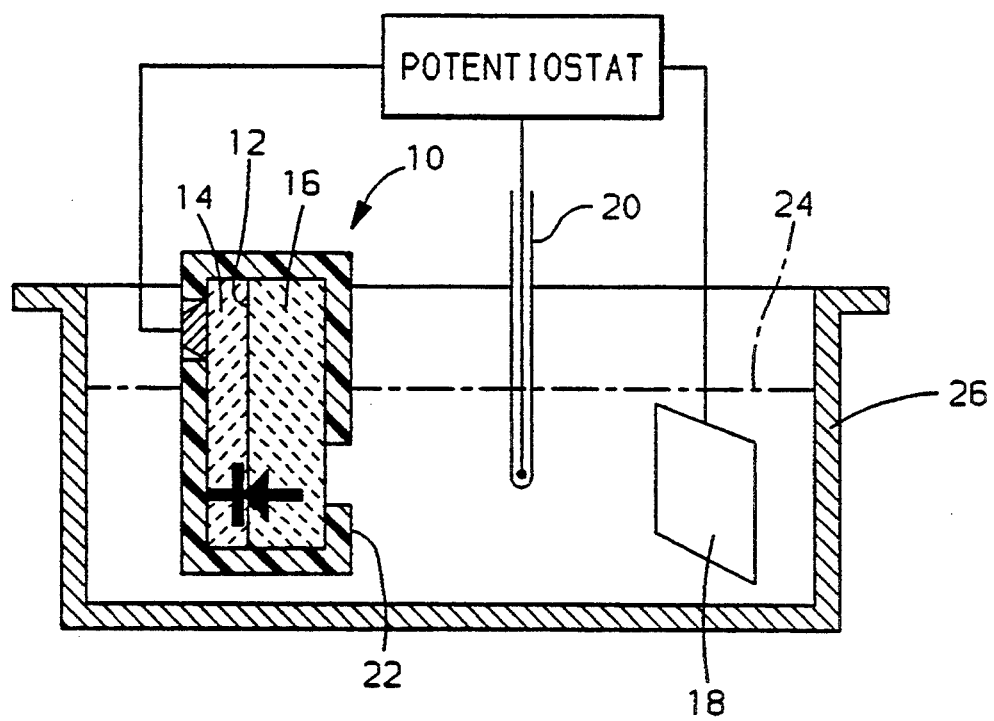
FIGS. 1A and 1B are schematic illustrations of typical three-electrode electrochemical etch systems of the prior art.
Figure 1B:
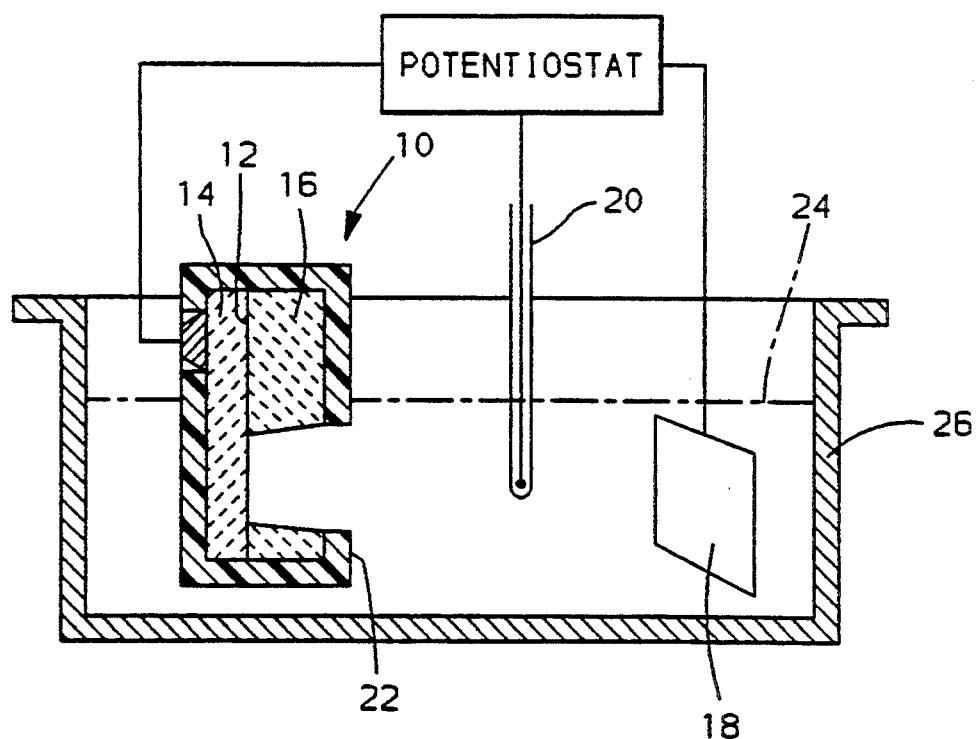
Figure 2A:
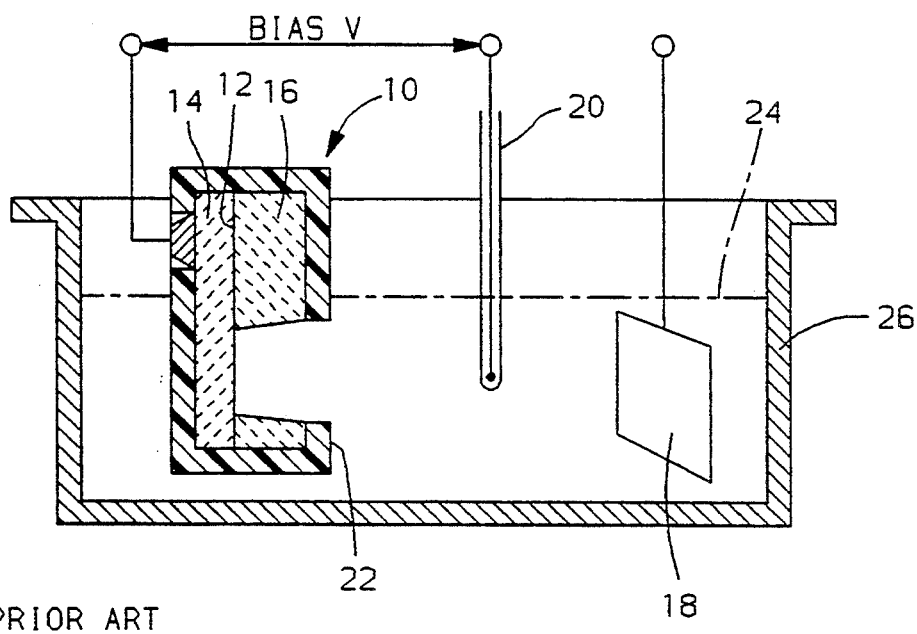
FIGS. 2A and 2B are schematic illustrations of an etching system using pulsed anodation to cause passivation of a p-type layer silicon while n-type silicon continues to etch, making it possible to selectively etch n-type and stop etch on p-type material.
Figure 2B:
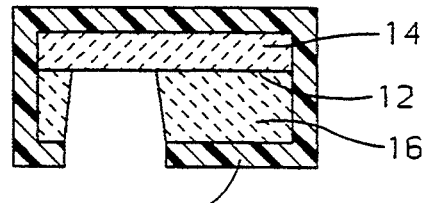
Figure 3:
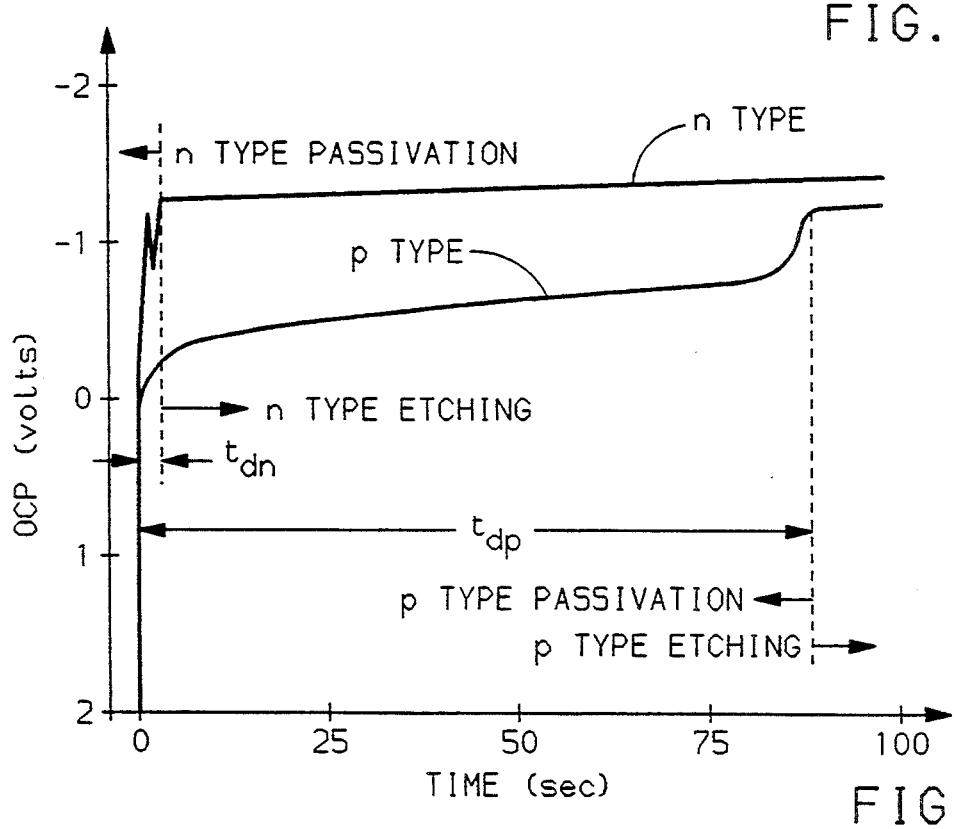
FIG. 3 is a graph of typical open circuit potential recovering curves p- and n-type samples after application of a 2 V, 1 second pulse in a 20% KOH solution at 60° C.
Figure 4B:
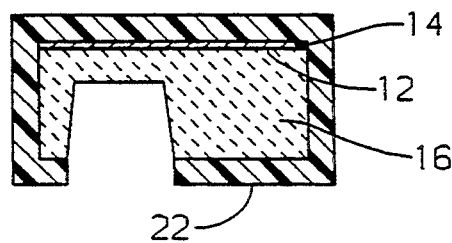

High voltage pulses (1 second duration and 30 second interval between pulses) were then applied between the working and the counterelectrodes. The silicon wafer working electrode was made the positive and the counterelectrode was made the negative. The reference electrode was employed to monitor the system. When the etching process proceeded to a certain point, it was found that the OCP recovery curves measured between the working and the reference electrodes changed from a typical n-type to a p-type silicon (see FIG. 3). This phenomenon implies that the silicon surface was passivated by the applied pulses and etching stopped. After measuring the thickness of the membrane, we found that the etching was actually stopped several microns away from the metallurgical junction (FIG. 4B).

Experimental results also indicate that the thickness of the membranes can be controlled by the amplitude of the pulsed anodizing voltages. As the amplitude was changed from 15 V to 100 V, the thickness of the membranes varied from 0.4 μm to 8.0 μm (Table I). In addition, the energy employed to implant the boron ions can also modulate the thickness of the membranes. Thicker membranes was fabricated if boron ions were implanted at a higher energy (Table I). Therefore, n-type membranes with various thickness can be fabricated using this technique.

It was reported that holes are needed for the silicon to form a thick enough anodic oxide during the application of an anodic pulse and to stop etching. Since hole concentration in n-type silicon is low, normally it would not be passivated by anodic pulses. However, the application of high amplitude pulses does passivate the n-type silicon and stop etching. Therefore, holes necessary for passivation must be injected into the n-type silicon from the shallow p-type layer. Because thicker membranes were formed as higher voltage pulses were applied (Table I), we believe that the penetration depth of the holes is controlled by the amplitude of the pulsed anodizing voltages.

The following example illustrates some of the objects, features and advantages of the present invention.

EXAMPLE I

In this example several semiconductor devices were prepared including an n-type region and a very shallow p-type layer prepared by boron implantation under the conditions set forth in Table I. Each of the semiconductor devices had a thickness of 550 μm before etching. The etching was preformed in a 20% solution of KOH at 60° C. The amplitude of the pulsed anodized voltages were varied from 15 V to 100 V and were applied for durations of approximately 1 second and a 30 second interval between pulses. The data in Table I corresponding to the results of these experiments verifies that n-type membranes with various thicknesses can be fabricated using the technique of the present invention.

TABLE I

| Parameters for boron implantation | Amplitude of the pulsed anodizing voltages | | | |
|---|---|---|---|---|
| | 15 V | 25 V | 50 V | 100 V |
| $1 \times 10^{13}$ ions/cm$^2$ (60 KeV) | 0.4 μm | 4.0 μm | 6.5 μm | 8.0 μm |
| $5 \times 10^{12}$ ions/cm$^2$ (160 KeV) | — | 5.0 μm | 9.0 μm | 10.0 μm |

The present invention has several advantages over electrochemical etch-stop and selective etch techniques of the prior art. First, the sample preparation procedure is simplified in that no epitaxial layer growth drive-in process is required. Second, the membranes fabricated using the present invention are virtually made from virgin n-type silicon. Therefore, their quality should be better than those fabricated from epitaxially grown silicon layers. Third, much lower boron dosage is needed for the present invention, e.g., $5 \times 10^{12}$ or $1 \times 10^{13}$ ions/cm$^2$ as compared to $1 \times 10^{16}$ needed for existing electrochemical etch-stop techniques. Lower dopant concentrations can reduce the internal stresses in the membranes produced. Fourth, much thinner silicon membranes can be fabricated using the present invention. These very thin silicon membranes have potential application in the area of silicon on silicon (SOI) technology using wafer bonding. Fifth, since the penetration depth, or diffusion length, of holes into the n-type silicon is a function of defect concentration in the semiconductor, the present invention has the potential to become an analytical tool for evaluating the quality of silicon wafers.

The embodiments of the invention in which an exclusive property or privilege is claimed as defined as follows:

1. A method of selectively etching a body of semiconductor material comprising:
   providing a silicon wafer as a working electrode including an n-type region and a shallow boron implanted p-type layer wherein the n-type region and p-type layer met to form a p/n junction;
   providing a counterelectrode;
   etching a portion of the n-type region by placing the working electrode and counterelectrode in a liquid etchant and making the working electrode electrically positive and the counterelectrode electrically negative to produce a forward biased p/n junction;

applying voltage pulses greater than 2 V between the working electrode and the counterelectrode so that holes are injected into the n-type region from the p-type layer and to stop etching a distance away from the p/n junction and provide a n-type membrane having a thickness ranging from 0.4 μm to 10.0 μm which is controlled by the amplitude of the pulse.

2. A method as set forth in claim 1 wherein the applied voltage pulse ranges from 2 V to 300 V.

3. A method as set forth in claim 2 wherein the pulse has a duration ranging from 1 millisecond to 100 seconds.

4. A method as set forth in claim 2 wherein the pulse ranges from 1 second to 100 seconds.

5. A method as set forth in claim 1 wherein the membrane formed has a thickness ranging from about 0.4 μm to about 0.8 μm.

6. A method as set forth in claim 1 wherein said p-type layer is prepared by boron implantation under conditions ranging from $1 \times 10^3$ ions/cm$^2$ at 60 KeV to $5 \times 10^{12}$ ions/cm$^2$ at 160 KeV.

7. A method as set forth in claim 1 wherein the applied voltage pulse ranges from about 15 V to 100 V.

8. A method as set forth in claim 1 wherein the etchant is at least one selected from the group comprising KOH, NaOH, LiOH, CsOH, NH$_4$OH, ethylenediamine pyrocatechol, and hydrazine.

9. A method as set forth in claim 8 wherein said etchant has a concentration ranging from 5 to 9.5% and a temperature ranging from about 10° C. to about 120° C.

10. A method as set forth in claim 8 wherein the etchant is a 20% solution of KOH at 60° C.

* * * * *